US 11,955,387 B2

(12) United States Patent
Cho et al.

(10) Patent No.: US 11,955,387 B2
(45) Date of Patent: Apr. 9, 2024

(54) METHOD OF FABRICATING A SEMICONDUCTOR DEVICE

(71) Applicant: SAMSUNG ELECTRONICS CO., LTD., Suwon-si (KR)

(72) Inventors: Seongkeun Cho, Suwon-si (KR); Eunhee Jeang, Paju-si (KR); Jihun Lee, Hwaseong-si (KR); Gyumin Jeong, Ulsan (KR); Hyunjae Kang, Gunpo-si (KR); Taemin Earmme, Hwaseong-si (KR)

(73) Assignee: Samsung Electronics Co., Ltd. (KR)

(*) Notice: Subject to any disclaimer, the term of this patent is extended or adjusted under 35 U.S.C. 154(b) by 325 days.

(21) Appl. No.: 17/386,323

(22) Filed: Jul. 27, 2021

(65) Prior Publication Data

US 2022/0199473 A1 Jun. 23, 2022

(30) Foreign Application Priority Data

Dec. 18, 2020 (KR) .................. 10-2020-0178020

(51) Int. Cl.
*H01L 21/66* (2006.01)
*H01L 21/311* (2006.01)

(52) U.S. Cl.
CPC ........ *H01L 22/12* (2013.01); *H01L 21/31144* (2013.01)

(58) Field of Classification Search
CPC ......... H01L 21/02115; H01L 21/02274; H01L 21/2636
See application file for complete search history.

(56) References Cited

U.S. PATENT DOCUMENTS

| 6,514,851 | B2 | 2/2003 | Saito |
| 8,373,288 | B2 | 2/2013 | Nakajima |
| 8,670,118 | B2 | 3/2014 | Den Boef |
| 9,557,655 | B2 | 1/2017 | Kim et al. |
| 9,841,688 | B2 | 12/2017 | Ko et al. |
| 2009/0311844 | A1 | 12/2009 | Lin et al. |
| 2020/0192230 | A1* | 6/2020 | Sokolov .............. G03F 7/70633 |

FOREIGN PATENT DOCUMENTS

| KR | 2003-0042495 A | 6/2003 |
| KR | 10-2120551 B1 | 6/2020 |

* cited by examiner

*Primary Examiner* — Monica D Harrison
*Assistant Examiner* — Andre C Stevenson
(74) *Attorney, Agent, or Firm* — Fish & Richardson P.C.

(57) ABSTRACT

A method of fabricating a semiconductor device is disclosed. The method may include forming a parent pattern, forming an upper thin film on the parent pattern, forming a child pattern on the upper thin film, measuring a diffraction light from the parent and child patterns to obtain an intensity difference curve of the diffraction light versus its wavelength, and performing an overlay measurement process on the parent and child patterns using the diffraction light, which has the same wavelength as a peak of the intensity difference curve located near a peak of reflectance of the parent and child patterns, to obtain an overlay measurement value.

10 Claims, 14 Drawing Sheets

METHOD OF FABRICATING A SEMICONDUCTOR DEVICE

CROSS-REFERENCE TO RELATED APPLICATION

Korean Patent Application No. 10-2020-0178020, filed on Dec. 18, 2020, in the Korean Intellectual Property Office, and entitled: "Method of Fabricating a Semiconductor Device," is incorporated by reference herein in its entirety.

BACKGROUND

1. Field

Embodiments relate to a method of fabricating a semiconductor device.

2. Description of the Related Art

An overlay measurement process may be performed to examine an extent of misalignment between a lower pattern and an upper pattern that are stacked on a substrate. Various overlay measurement values may be obtained from several positions on the substrate through the overlay measurement process.

SUMMARY

Embodiments are directed to a method of fabricating a semiconductor device, the method including: forming a lower pattern on a substrate, the lower pattern including a parent pattern; forming an upper thin film on the lower pattern and the substrate; forming a photoresist pattern on the upper thin film, the photoresist pattern including a child pattern located on the parent pattern; measuring a diffraction light from the parent and child patterns to obtain an intensity difference curve of the diffraction light versus its wavelength; measuring a first reflection light from the parent pattern to obtain a first reflectance versus its wavelength; measuring a second reflection light from the child pattern to obtain a second reflectance versus its wavelength; examining whether a first peak of the first reflectance is smaller than a second peak of the second reflectance; and obtaining a first wavelength corresponding to a peak of the intensity difference curve located near the first peak, and performing an overlay measurement process on the parent and child patterns using a diffraction light that has the first wavelength to obtain an overlay measurement value, when the first peak is smaller than the second peak.

Embodiments are also directed to a method of fabricating a semiconductor device, the method including: forming a lower pattern on a substrate, the lower pattern including a parent pattern; forming an upper thin film on the lower pattern and the substrate; forming a photoresist pattern on the upper thin film, the photoresist pattern including a child pattern located on the parent pattern; measuring a first reflection light from the parent pattern to obtain a first reflectance; measuring a second reflection light from the child pattern to obtain a second reflectance; examining whether a first peak of the first reflectance is smaller than a second peak of the second reflectance; and performing an overlay measurement process on the parent and child patterns using a diffraction light that has a same wavelength as the first peak, when the first peak is smaller than the second peak.

Embodiments are also directed to a method of fabricating a semiconductor device, the method including: forming a parent pattern in a diffraction region and a first reflection region of a substrate; forming an upper thin film on the parent pattern and the substrate; forming a child pattern in the diffraction region and a second reflection region of the substrate; measuring a diffraction light from the parent and child patterns in the diffraction region to obtain an intensity difference curve of the diffraction light versus its wavelength; measuring a first reflection light from the parent pattern in the first reflection region to obtain a first reflectance versus its wavelength; measuring a second reflection light from the child pattern in the second reflection region to obtain a second reflectance versus its wavelength; and performing an overlay measurement process on the parent and child patterns in the diffraction region using a diffraction light that has a same wavelength as a peak of the intensity difference curve located near a first peak of the first reflectance or a second peak of the second reflectance, to obtain an overlay measurement value.

BRIEF DESCRIPTION OF THE DRAWINGS

Features will become apparent to those of skill in the art by describing in detail example embodiments with reference to the attached drawings in which.

DETAILED DESCRIPTION

Figure 1:
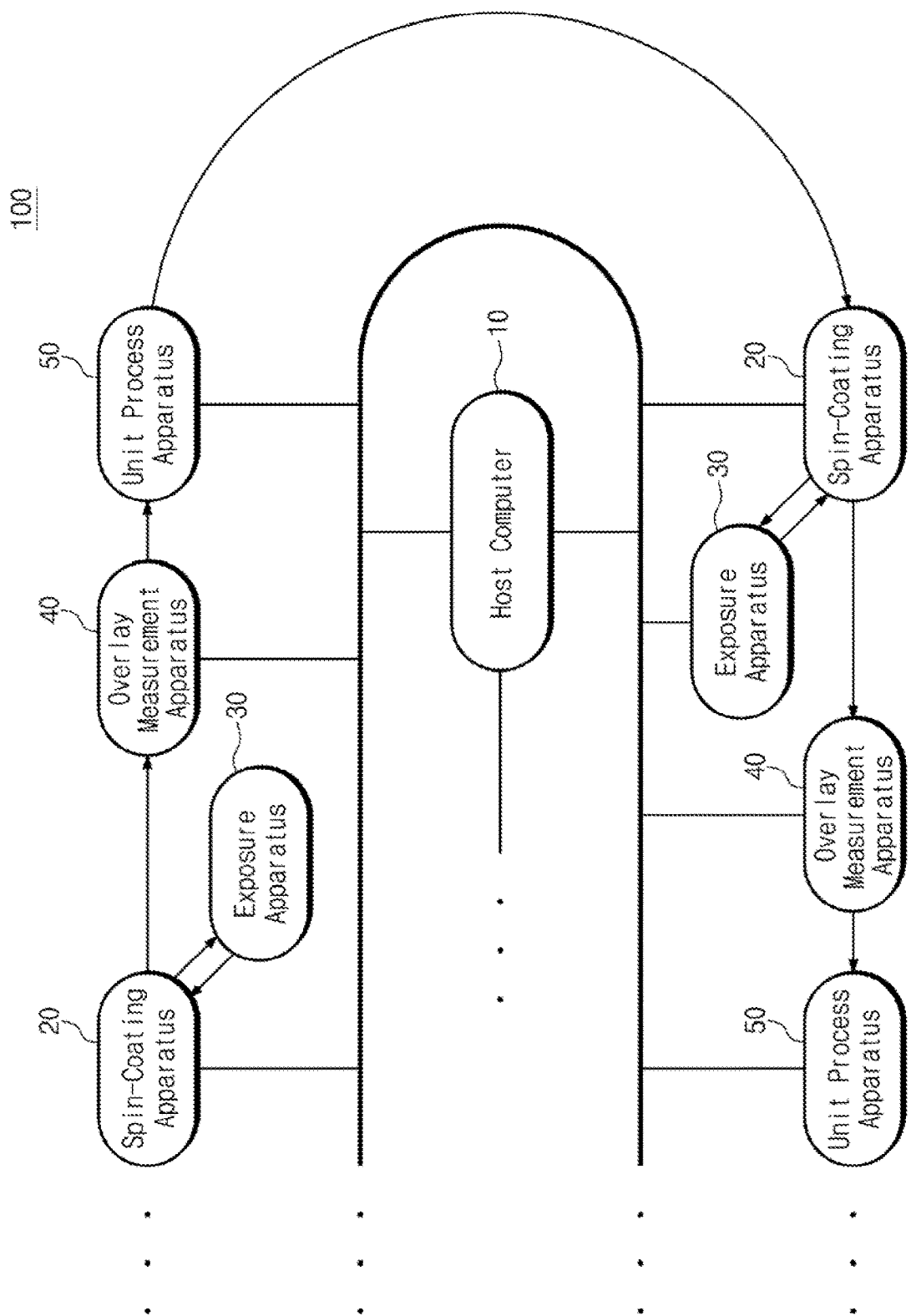
FIG. 1 is a diagram schematically illustrating a system, which is used to fabricate a semiconductor device, according to an example embodiment.

FIG. 1 illustrates an example of a fabrication system 100, which is used to fabricate a semiconductor device, according to an example embodiment.

Referring to FIG. 1, the fabrication system 100 may include a host computer 10, a spin-coating apparatus 20, an exposure apparatus 30, an overlay measurement apparatus 40, and a unit process apparatus 50.

The host computer 10 may be connected to the spin-coating apparatus 20, the exposure apparatus 30, the overlay measurement apparatus 40, and the unit process apparatus 50. The host computer 10 may be used to monitor a fabricating process on a substrate W (e.g., see FIG. 5) and a process of measuring an overlay value. For example, the host computer 10 may be configured to provide an overlay correction value, which is measured by the overlay measurement apparatus 40, to the exposure apparatus 30.

Figure 5:
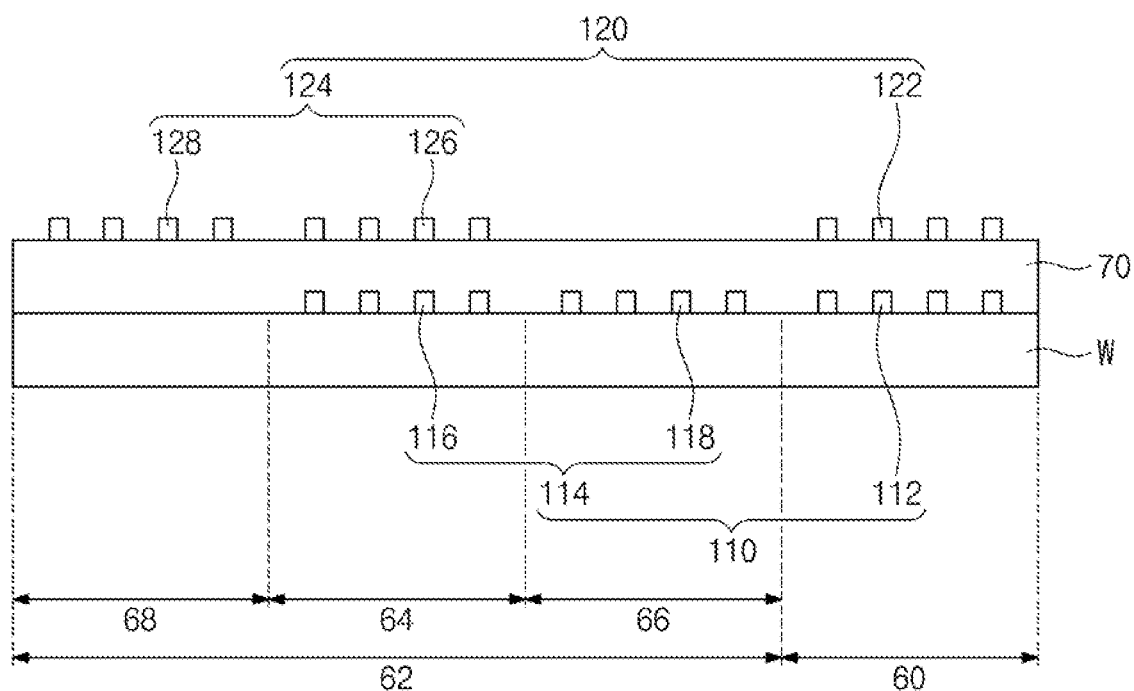

The spin-coating apparatus 20 may be configured to form a photoresist layer on the substrate W in a spinning coating manner, and the photoresist layer may be exposed by the exposure apparatus 30 and then may be developed to form photoresist patterns 120 (e.g., see FIG. 5).

The exposure apparatus 30 may be disposed adjacent to the spin-coating apparatus 20. The exposure apparatus 30 may be configured to expose a portion of the photoresist layer to ultraviolet (UV) light or extreme ultraviolet (EUV) light. The exposure apparatus 30 may include a reticle with mask patterns, and here, the mask patterns may be provided to correspond to target patterns, which will be formed on the substrate W. In an example embodiment, the exposure apparatus 30 may be configured to use EUV, ArF, KrF, i-line, or G-line light for the exposure process.

The overlay measurement apparatus 40 may be disposed between the spin-coating apparatus 20 and the unit process apparatus 50. In an example embodiment, the overlay measurement apparatus 40 may include an optical microscope. The overlay measurement apparatus 40 may be configured to obtain an overlay image from the photoresist patterns 120 and lower patterns 110 (e.g., see FIG. 5) below the photoresist patterns 120. In the overlay measurement apparatus 40, the overlay image may be used to obtain an overlay measurement value. The overlay measurement value may be a value indicating an extent of misalignment between parent patterns 114 (e.g., see FIG. 5) of the lower patterns 110 and child patterns 124 (e.g., see FIG. 5) of the photoresist pattern 120. The overlay measurement value may include an after-development inspection (ADI) overlay value.

The unit process apparatus 50 may be provided between the overlay measurement apparatus 40 and the spin-coating apparatus 20. In an example embodiment, the unit process apparatus 50 may be at least one of a thin film deposition apparatus, an etching apparatus, a polishing apparatus, an ion implantation apparatus, a cleaning apparatus, and an ashing apparatus. In an example embodiment, the unit process apparatus 50 may be configured to etch the substrate W or a thin film on the substrate W using the photoresist patterns 120 as a mask. In another implementation, the unit process apparatus 50 may be configured to polish or planarize the substrate W or the thin film. In an example embodiment, the unit process apparatus 50 may be used to form the lower patterns 110 (e.g., see FIG. 3), an upper thin film 70 (e.g., see FIG. 4), and/or an upper pattern on the substrate W.

Although not shown, an electron microscope may be further provided between the unit process apparatus 50 and the spin-coating apparatus 20. The electron microscope may be used to perform an after-cleaning inspection (ACI) process on the lower patterns 110 or the photoresist patterns 120.

Hereinafter, a method of fabricating a semiconductor device, e.g., using the fabrication system 100, will be described.

Figure 2:
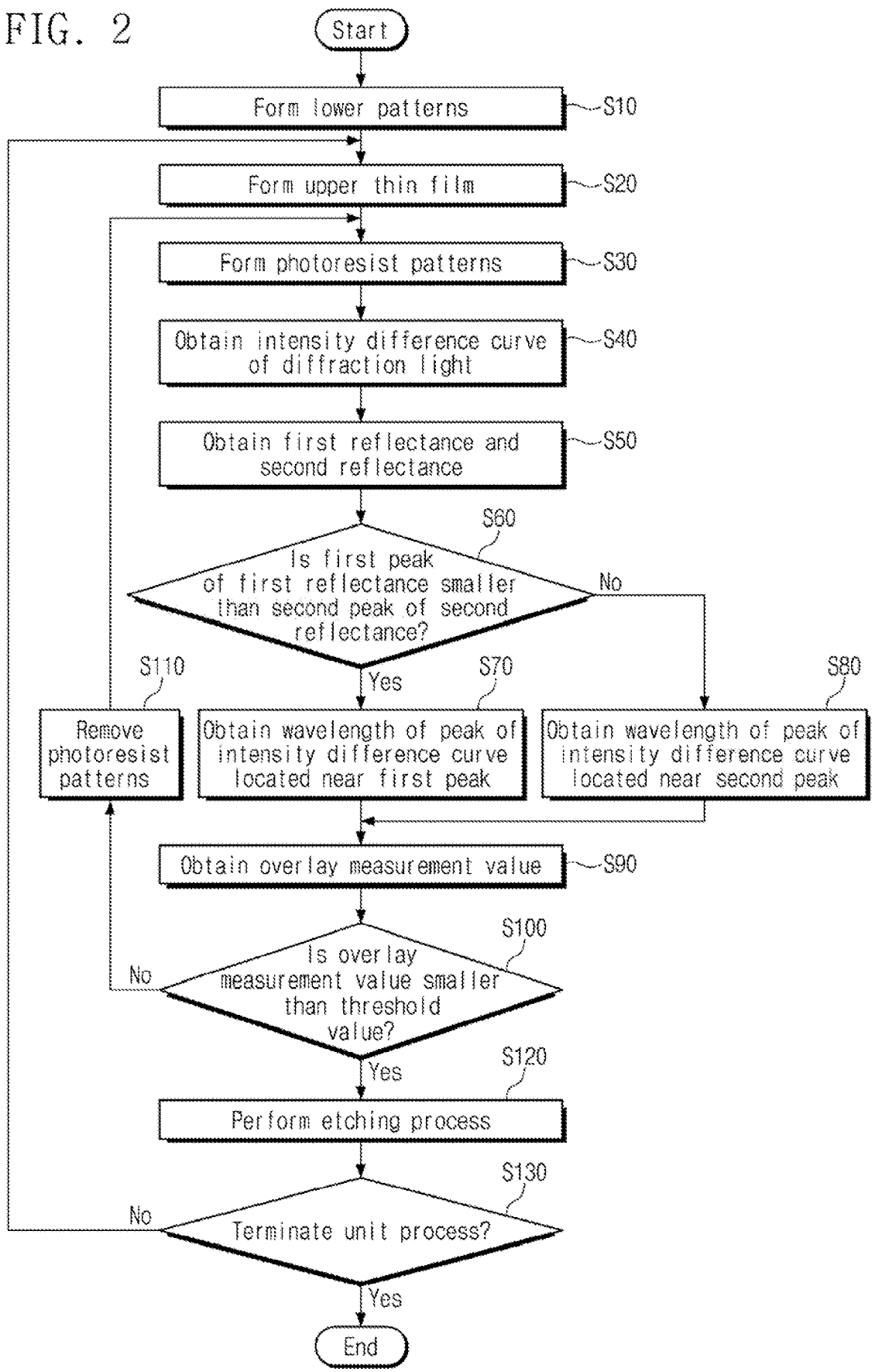
FIG. 2 is a flow chart illustrating a method of fabricating a semiconductor device, according to an example embodiment.
Figure 3:
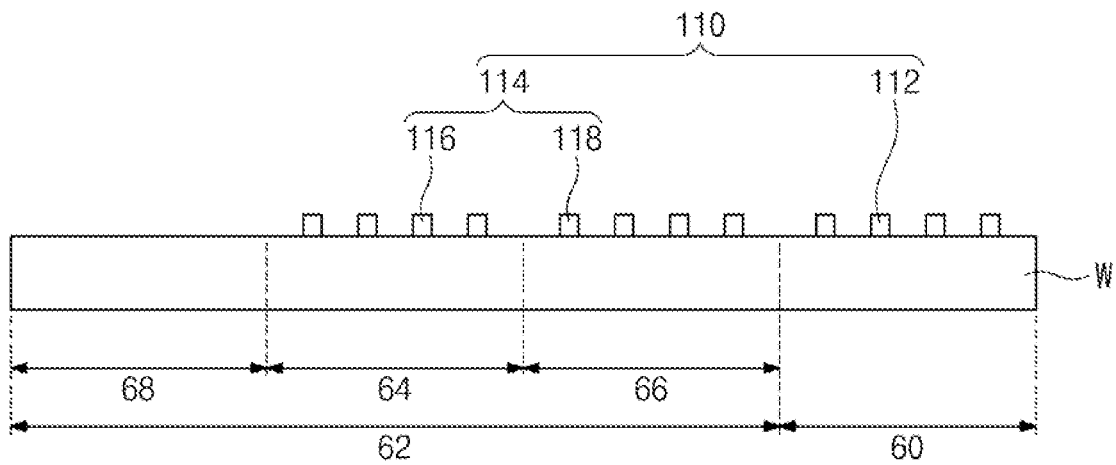
FIGS. 3 to 5 are sectional views illustrating a process of fabricating a semiconductor device, according to an example embodiment.
Figure 4:
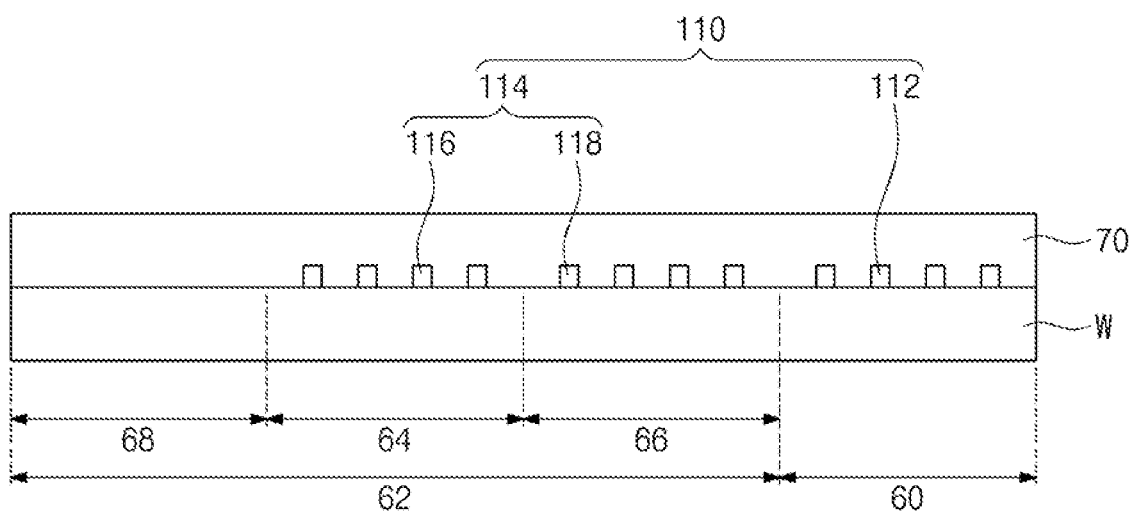
Figure 6:
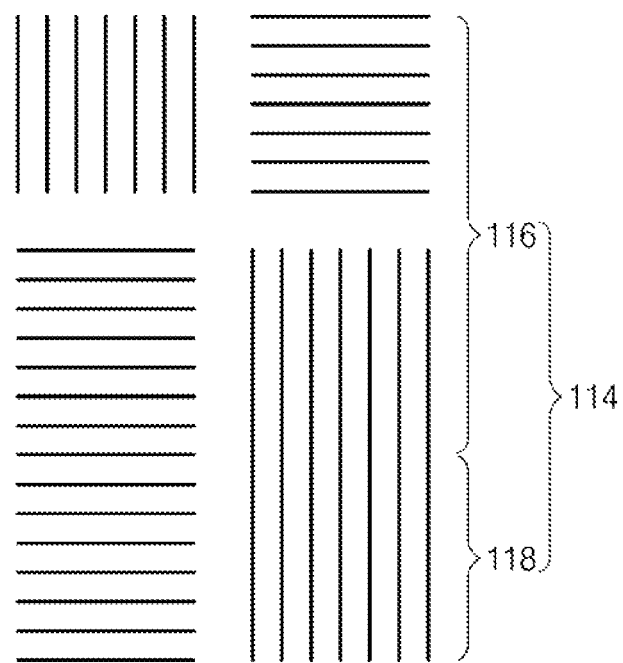
FIGS. 6 and 7 are plan views illustrating an example of parent and child patterns of FIG. 5.
Figure 6:
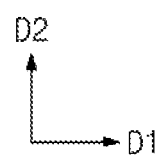
Figure 7:
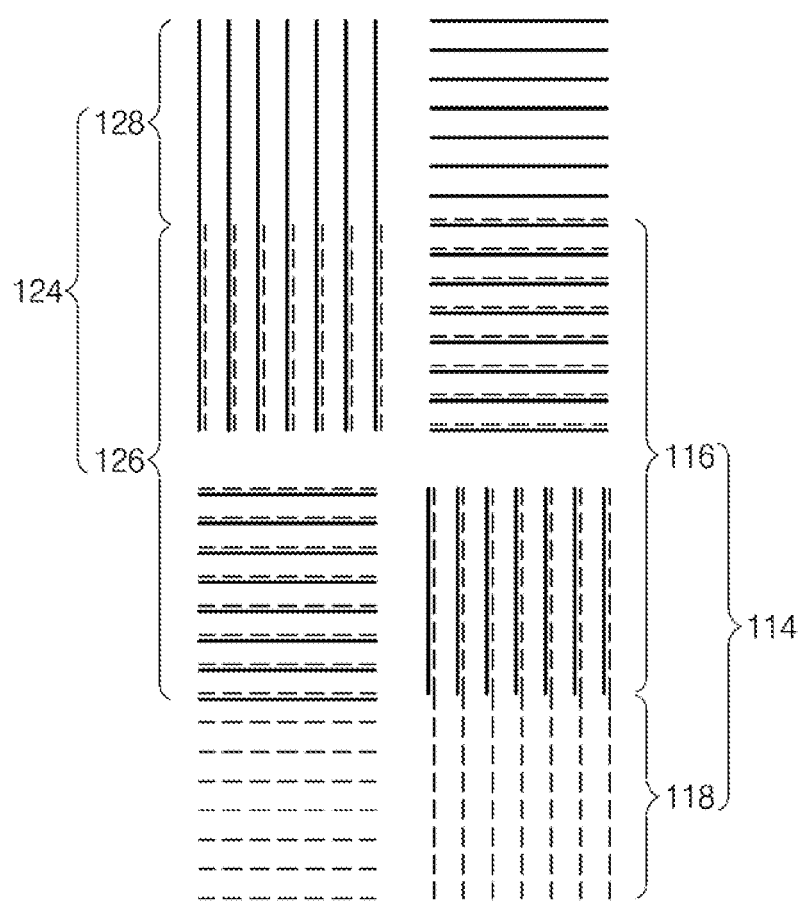
Figure 7:
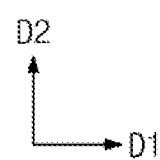

FIG. 2 illustrates a method of fabricating a semiconductor device, according to an example embodiment. FIGS. 3 to 5 are sectional views illustrating a process of fabricating a semiconductor device, according to an example embodiment. FIGS. 6 and 7 illustrate an example of the parent and child patterns 114 and 124 of FIG. 5.

Referring to FIGS. 2, 3, and 6, the lower patterns 110 may be formed on the substrate W, e.g., using the unit process apparatus 50 (in S10). The substrate W may include a silicon wafer. In an example embodiment, the substrate W may include a cell region 60 and a peripheral region 62. The cell region 60 may be a region on which memory devices (not shown) are formed. The peripheral region 62 may be provided near or around the cell region 60. Although not shown, the peripheral region 62 may be provided to enclose or delimit the cell region 60. The peripheral region 62 may be a region on which a circuit for driving memory devices is formed.

The overlay patterns (e.g., the parent and child patterns 114 and 124 of FIG. 5) may be formed on the peripheral region 62.

In an example embodiment, the peripheral region 62 may include a diffraction region 64, a first reflection region 66, and a second reflection region 68. The diffraction region 64 may be provided between the first reflection region 66 and the second reflection region 68. The first reflection region 66 may be provided between the cell region 60 and the diffraction region 64. The second reflection region 68 may be provided at one side of the diffraction region 64 that is opposite to the first reflection region 66. Thus, the first reflection region 66 and the second reflection region 68 may be spaced apart from each other with the diffraction region 64 interposed between.

The lower patterns 110 may be formed on the cell region 60, the diffraction region 64, and the first reflection region 66. In an example embodiment, the lower patterns 110 may include memory cell patterns 112 and the parent patterns 114. The memory cell patterns 112 may be formed in the cell region 60. The parent patterns 114 may be formed in the peripheral region 62.

In an example embodiment, the parent patterns 114 may be embossed patterns. In another implementation, the parent patterns 114 may be engraved patterns.

The parent patterns 114 may include grating patterns, which are arranged in a first direction D1 and a second direction D2. As an example, the parent patterns 114 may include first diffraction patterns 116 and first reflection patterns 118. The first diffraction patterns 116 may be formed in the diffraction region 64. The first reflection patterns 118 may be formed in the first reflection region 66. The lower patterns 110 may not be provided on the second reflection region 68 of the substrate W.

Referring to FIGS. 2 and 4, the upper thin film 70 may be formed on the lower patterns 110 and the substrate W, e.g., using the unit process apparatus 50 (in S20). The upper thin film 70 may cover the parent patterns 114. The upper thin film 70 may be thicker than the lower patterns 110. The upper thin film 70 may have a flat top surface. The upper thin film 70 may be transparent to light from the lower patterns 110. The upper thin film 70 may be formed of or include, e.g., a dielectric material (e.g., silicon oxide or silicon nitride).

Referring to FIGS. 2, 5, and 7, the photoresist patterns 120 may be formed on the upper thin film 70, e.g., using the spin-coating apparatus 20 and the exposure apparatus 30 (in S30). The upper thin film 70 may be coated with a photoresist layer, e.g., using the spin-coating apparatus 20. In the exposure apparatus 30, the mask pattern of the reticle may be used to selectively expose the photoresist layer to light. In an example embodiment, the exposed photoresist layer may be developed by a developer of the spin-coating apparatus 20 to form the photoresist patterns 120.

In an example embodiment, the photoresist patterns 120 may include cell masking patterns 122 and the child patterns 124. The cell masking patterns 122 may be formed on the memory cell patterns 112. The child patterns 124 may be formed on the parent patterns 114. The child patterns 124 may be formed in the diffraction region 64 and the second reflection region 68 of the peripheral region 62. The photoresist patterns 120 may not be provided on a region of the upper thin film 70 on the first reflection region 66.

The child patterns 124 may have the same shape as the parent patterns 114. For example, the child patterns 124 may include grating patterns arranged in the first and second directions D1 and D2. In an example embodiment, the parent and child patterns 114 and 124 may be formed in a region that has a width of about 2 μm to about 30 μm in the first or second direction D1 or D2, and may be arranged to have a pitch of about 0.2 μm to about 0.8 μm. In addition, each of the parent and child patterns 114 and 124 may have a line width of about 100 nm to about 300 nm and a height of about 50 nm to about 200 nm. The parent and child patterns 114 and 124 may be formed to have an offset or bias of about −30 nm to about 30 nm, in the first or second direction D1 or D2.

In an example embodiment, the child patterns 124 may include second diffraction patterns 126 and second reflection patterns 128. The second diffraction patterns 126 may be formed in the diffraction region 64. The second diffraction patterns 126 may be formed on the first diffraction patterns 116. The second diffraction patterns 126 may be aligned to the first diffraction patterns 116. The second reflection patterns 128 may be formed in the second reflection region 68.

Although not shown, the photoresist patterns 120 may further include circuit masking patterns formed in the peripheral region 62.

FIGS. 8 to 12 illustrate examples of the parent and child patterns 114 and 124.

Referring to FIGS. 7 to 12, the parent and child patterns 114 and 124 may be provided to form a shape of, e.g., a letter 'L', a letter 'I', or a square.

Figure 8:
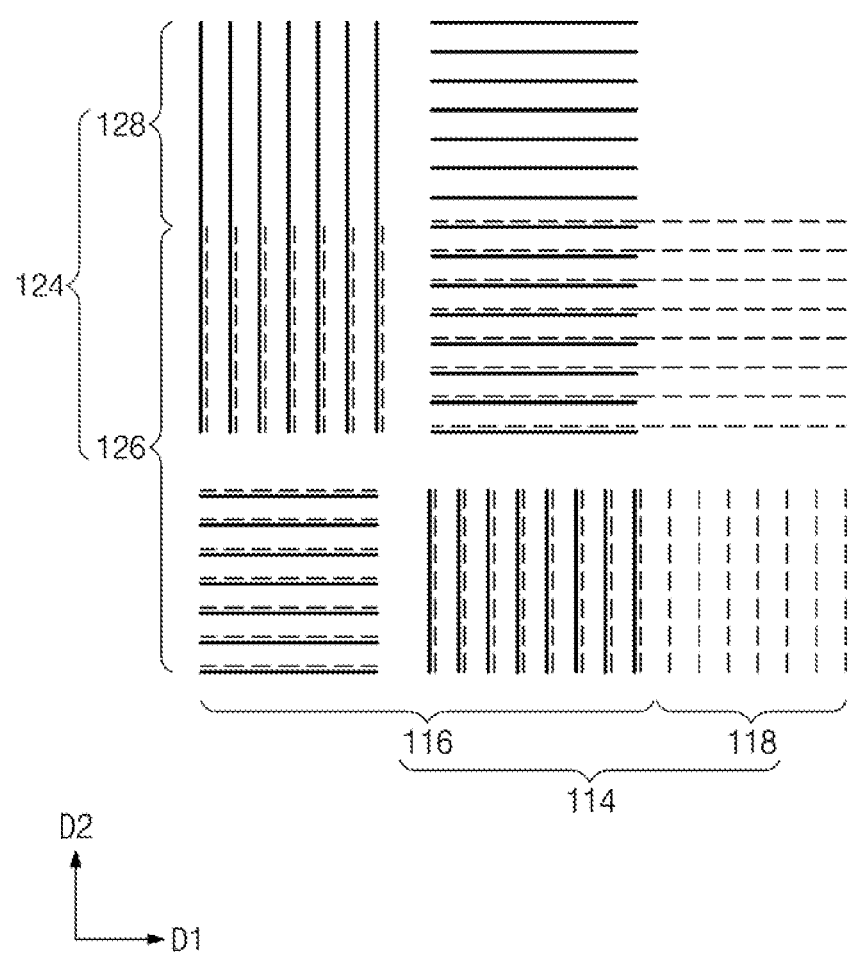
FIGS. 8 to 12 are plan views illustrating examples of the parent and child patterns.
Figure 10:
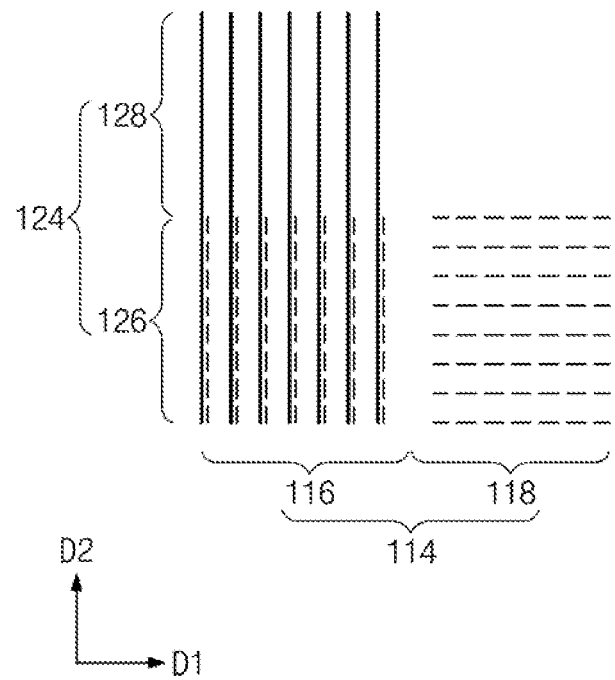
Figure 11:
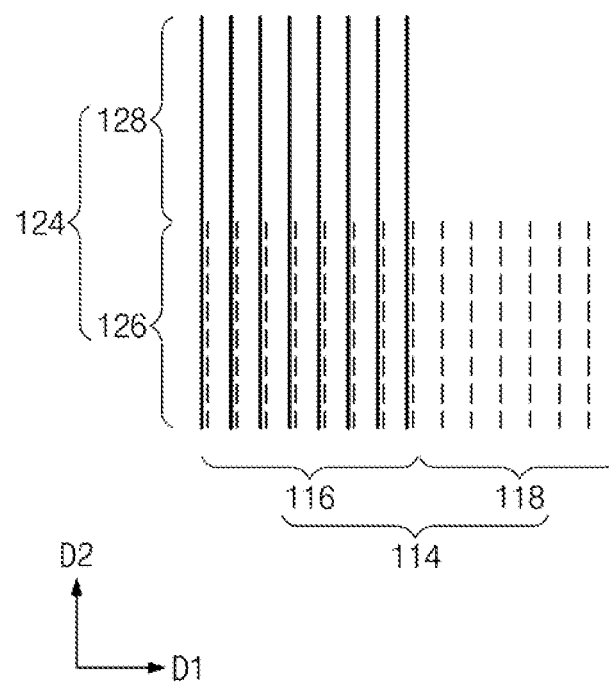

Referring to FIGS. 8, 10, and 11, the parent and child patterns 114 and 124 may be provided to form the shape of letter 'L'. The parent patterns 114 may be arranged in the first direction D1, and the child patterns 124 may be arranged in the second direction D2, thus forming the "L" shape.

Figure 9:
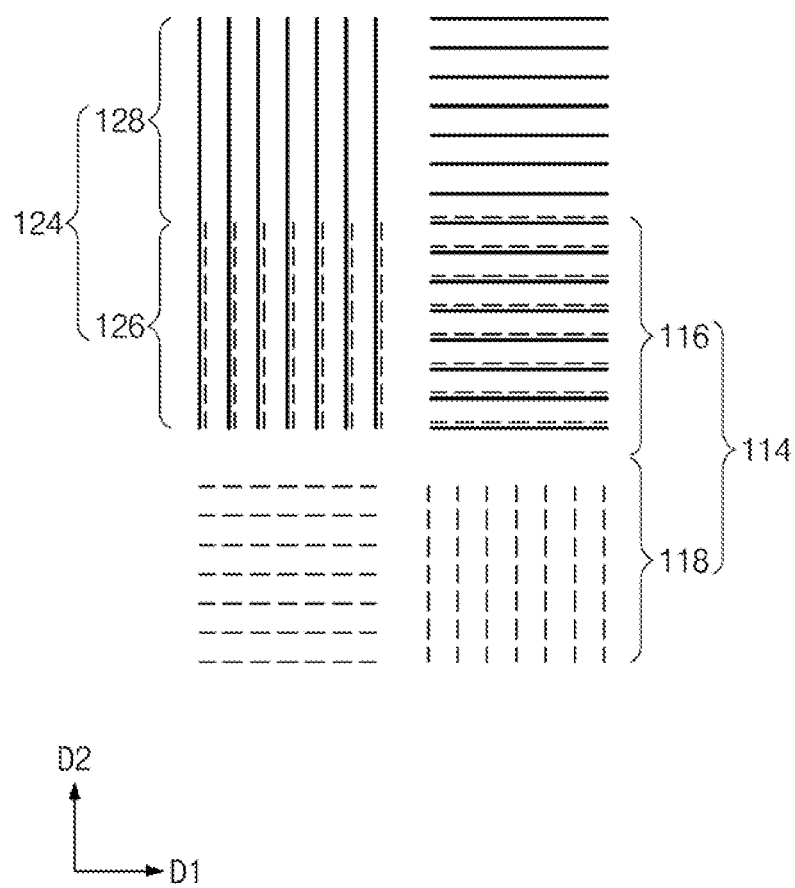

Referring to FIGS. 7 and 9, the parent and child patterns 114 and 124 may be provided to form the shape of letter 'I'. All of the parent and child patterns 114 and 124 may be arranged in the second direction D2, thus forming the "I" shape. In another implementation, all of the parent and child patterns 114 and 124 may be arranged in the first direction D1.

Figure 12:
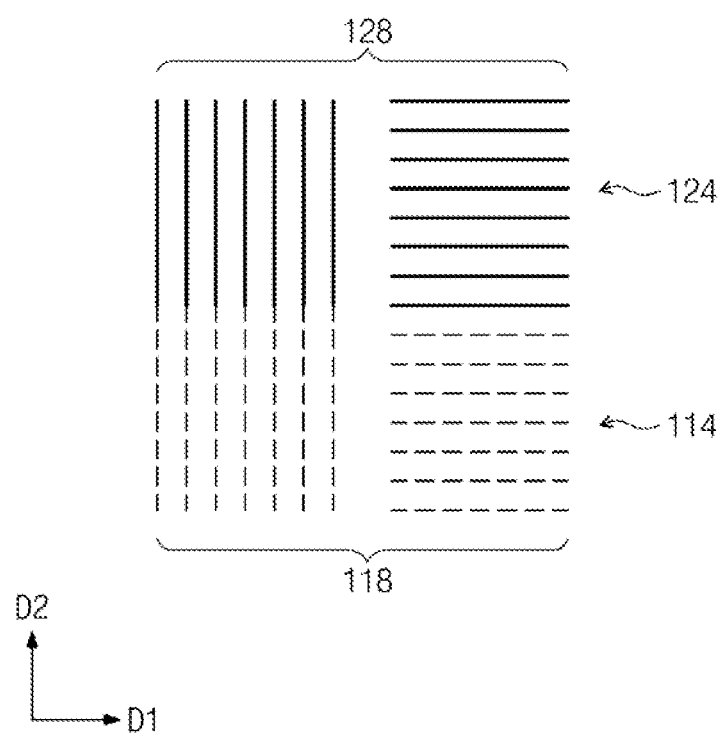

Referring to FIG. 12, the parent patterns 114 and the child patterns 124 may include the first reflection patterns 118 and the second reflection patterns 128, respectively, and may be arranged to form a square shape, without the first and second diffraction patterns 116 and 126.

Figure 13:
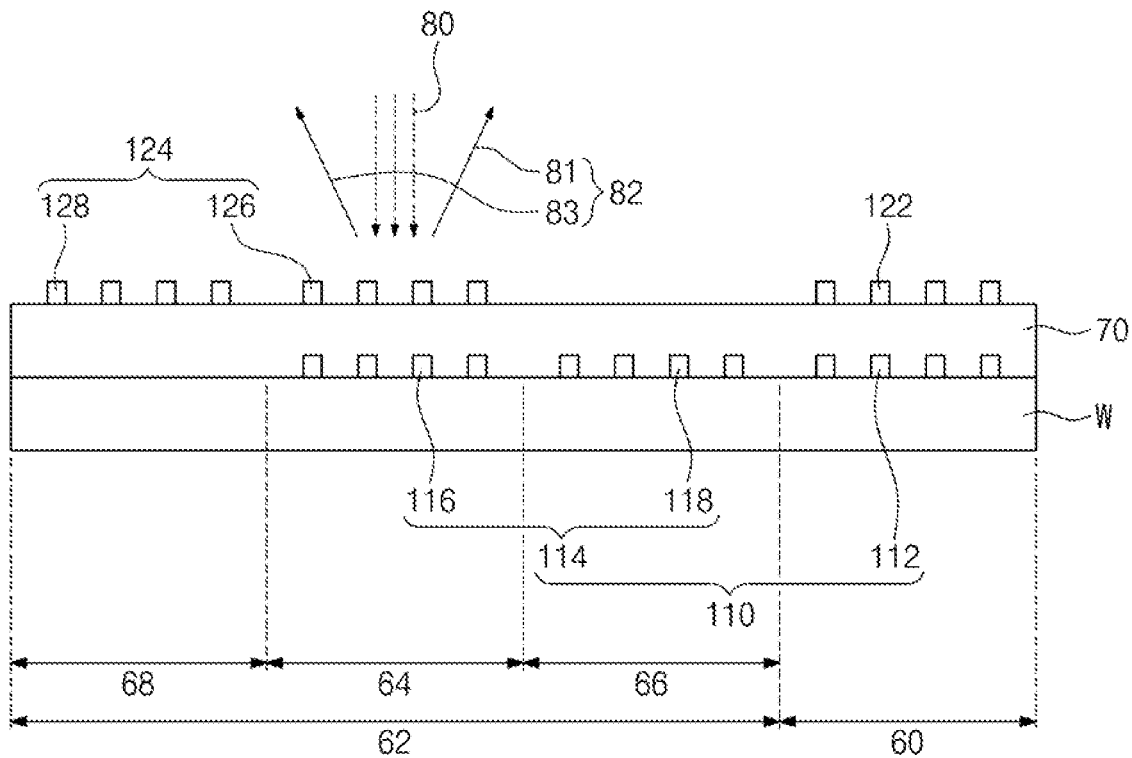
FIG. 13 is a sectional view illustrating light diffracted by first and second diffraction patterns of FIG. 5.
Figure 14:
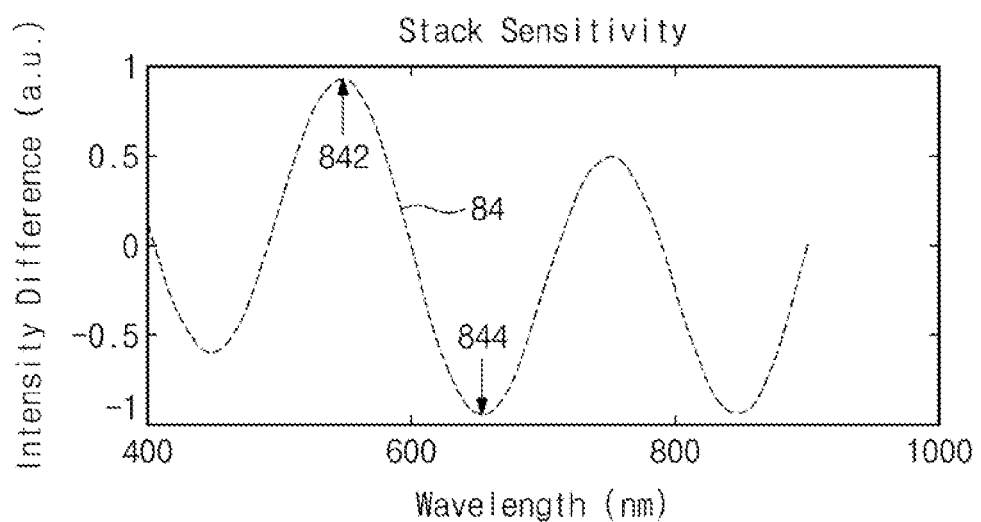
FIG. 14 illustrates a graph showing an intensity difference curve of the diffraction light of FIG. 13 versus its wavelength.

FIG. 13 illustrates a diffraction light 82 that is diffracted by the first and second diffraction patterns 116 and 126 of FIG. 5. FIG. 14 shows an intensity difference curve 84 of the diffraction light 82 of FIG. 13 versus its wavelength.

Referring to FIGS. 2, 13, and 14, the overlay measurement apparatus 40 may be configured to provide a first irradiation light 80 to the first and second diffraction patterns 116 and 126, and to obtain the intensity difference curve 84 of the diffraction light 82 versus its wavelength (in S40). For example, the first irradiation light 80 and the diffraction light 82 may include visible or near-infrared light whose wavelength ranges from about 400 nm to 850 nm. The first irradiation light 80 may be incident into the first and second diffraction patterns 116 and 126 in a direction normal to a top surface of the substrate W. The diffraction light 82 may be a portion of the first irradiation light 80, which is diffracted by the first and second diffraction patterns 116 and 126.

In an example embodiment, the diffraction light 82 may include a first positive order light 81 and a first negative order light 83. The first positive order light 81 may propagate in a right direction of the first irradiation light 80 from the first and second diffraction patterns 116 and 126. The first negative order light 83 may propagate in a left direction of the first irradiation light 80 from the first and second diffraction patterns 116 and 126. Although not shown, the diffraction light 82 may further include a zeroth order light propagating in a direction normal to the top surface of the substrate W.

The intensity difference curve 84 may be given by a difference in intensity between the first positive order light 81 and the first negative order light 83. For example, the intensity difference curve 84 may be stack sensitivity. The intensity difference curve 84 may be given by a formula of $2((I_{+1}-I_{-1})/(I_{+1}+I_{-1}))$, where "$I_{+1}$" is the intensity of the first positive order light 81 and "$I_{-1}$" is the intensity of the first negative order light 83. In an example embodiment, the intensity difference curve 84 may be obtained as a set of values measured at some, e.g., two or more, wavelengths of the first irradiation light 80 and the diffraction light 82.

A general overlay measurement process (e.g., a diffraction-based overlay (DBO) measurement process) may be performed by the diffraction light 82 whose wavelength corresponds to a highest peak 842 and a lowest peak 844 of the intensity difference curve 84. For example, the highest peak 842 of the intensity difference curve 84 may occur a wavelength of about 550 nm, and the lowest peak 844 may occur a wavelength of about 650 nm. However, the highest and lowest peaks 842 and 844 of the intensity difference curve 84 of the diffraction light 82 may be abnormally increased by a reflectance and/or a reflection noise of the first and second diffraction patterns 116 and 126. Thus, the reflectance and/or the reflection noise of the first and second diffraction patterns 116 and 126 may cause distortion of the intensity difference curve 84 of the diffraction light 82. Thus, due to the reflectance and/or the reflection noise of the first and second diffraction patterns 116 and 126, the highest and lowest peaks 842 and 844 of the intensity difference curve 84 may serve as a cause or factor reducing reliability of the overlay measurement process.

In a method of fabricating a semiconductor device according to an example embodiment, reflectance of the first and second reflection patterns 118 and 128 may be used to compensate the distortion of the intensity difference curve 84, and may increase the reliability of the overlay measurement process.

Hereinafter, an overlay measurement process, in which the reflectance of the first and second reflection patterns 118 and 128 is used, will be described in more detail.

Figure 15:
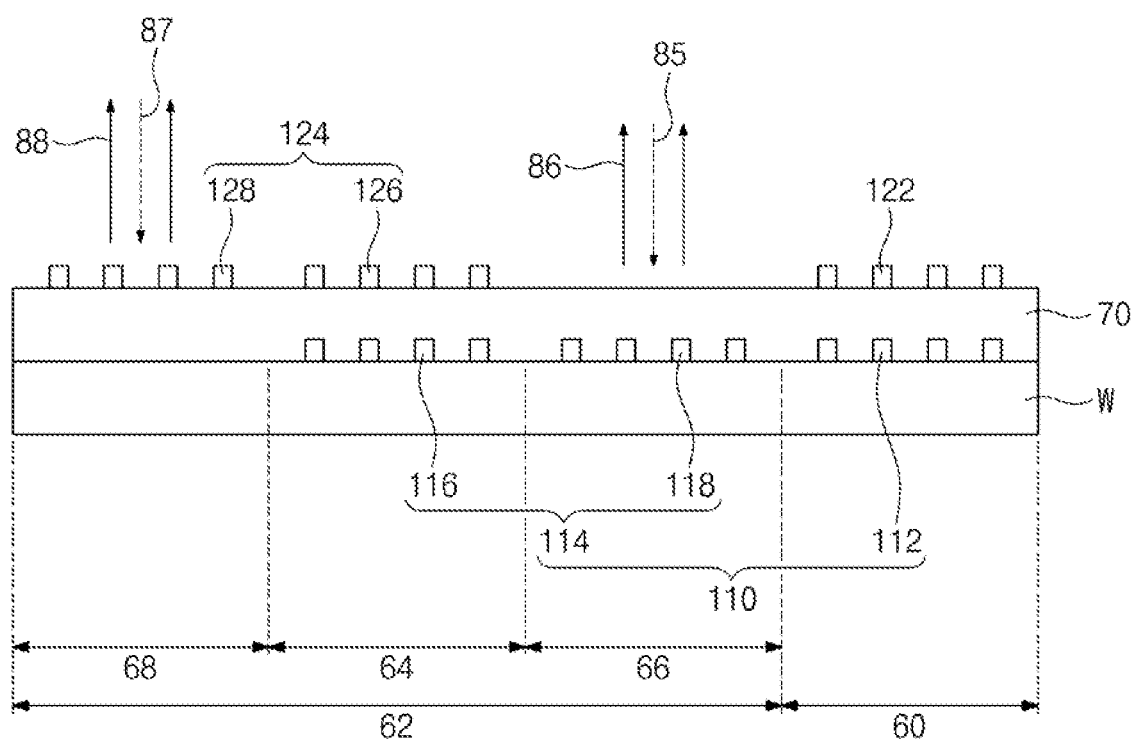
FIG. 15 is a sectional view illustrating a first reflection light and a second reflection light, which are respectively reflected by first reflection patterns and second reflection patterns.
Figure 16:
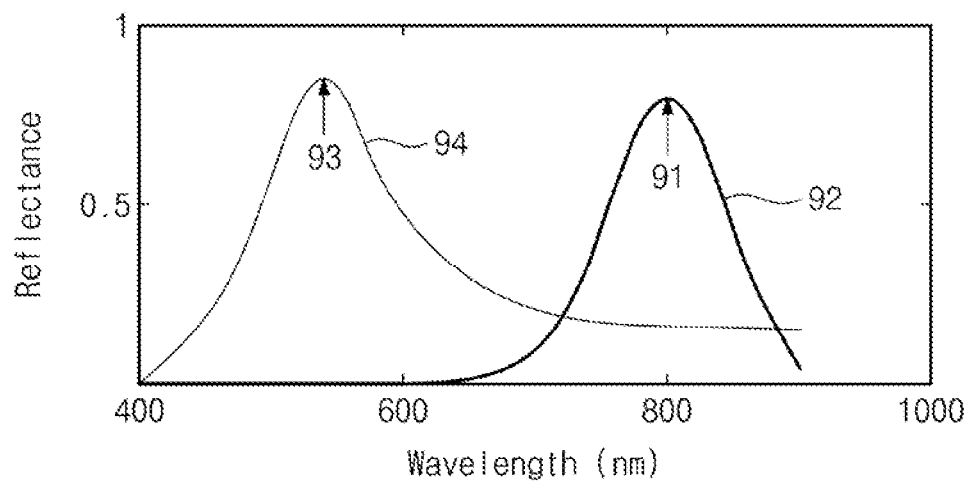
FIG. 16 illustrates graphs showing an example of a first reflectance of the first reflection light and a second reflectance of the second reflection light.

FIG. 15 illustrates a first reflection light 86 and a second reflection light 88, which are reflected by the first and second reflection patterns 118 and 128, respectively. FIG. 16 illustrates an example of a first reflectance 92 of the first reflection light 86 and a second reflectance 94 of the second reflection light 88.

Referring to FIGS. 2, 15, and 16, the first reflectance 92 and the second reflectance 94 may be obtained by measuring the first and second reflection lights 86 and 88, which are reflected from the first and second reflection patterns 118 and 128, respectively, using, e.g., the overlay measurement apparatus 40 (in S50). The first and second reflection lights 86 and 88 may be sequentially measured.

For example, first, the first reflection light 86 may be produced by a second irradiation light 85. For example, the first reflection light 86 may be a portion of the second irradiation light 85, which is incident into the first reflection patterns 118 on the first reflection region 66 and is reflected by the first reflection patterns 118. The first reflection light 86 may propagate in an opposite direction to the second irradiation light 85, e.g., along a normal. The first reflectance 92 may be obtained by measuring the first reflection light 86 within a predetermined wavelength range using, e.g., the overlay measurement apparatus 40. The first reflectance 92 may have a first peak 91. For example, the first peak 91 of the first reflectance 92 may occur around a near infrared wavelength of about 820 nm.

Next, the second reflection light 88 may be produced by a third irradiation light 87. For example, the second reflection light 88 may be a portion of the third irradiation light 87, which is incident into the second reflection patterns 128 on the second reflection region 68 and is reflected by the second reflection patterns 128. The second reflection light 88 may propagate in an opposite direction to the third irradiation light 87, e.g., along a normal. The second reflectance 94 may be obtained by measuring the second reflection light 88 within a predetermined wavelength range using, e.g., the overlay measurement apparatus 40. The second reflectance 94 may have a second peak 93. The second peak 93 of the second reflectance 94 may occur around a visible wavelength of about 500 nm.

The overlay measurement apparatus 40 or the host computer 10 may examine whether the first peak 91 of the first reflectance 92 is smaller than the second peak 93 of the second reflectance 94 (in S60).

Figure 17:
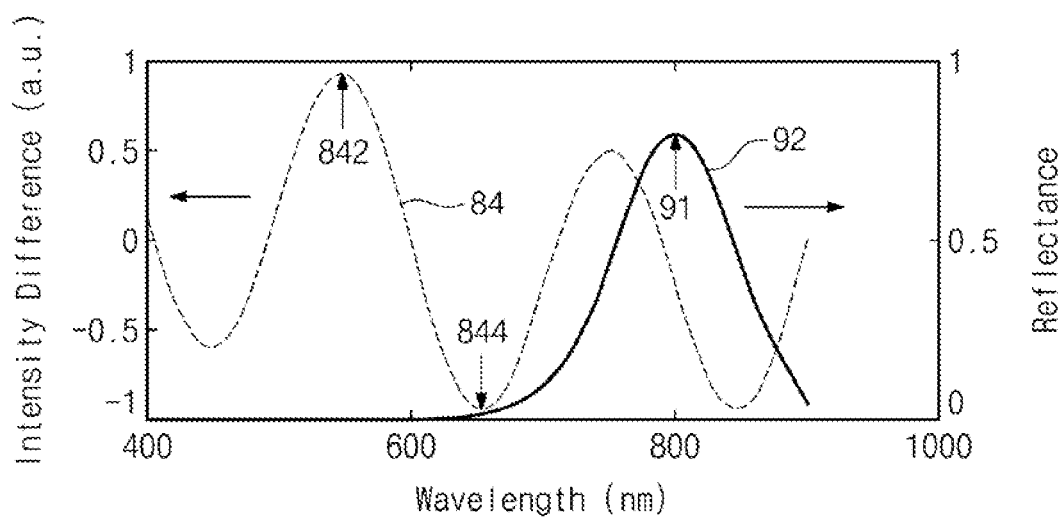
FIG. 17 illustrates graphs showing the intensity difference curve of FIG. 14 and the first reflectance of FIG. 16.

FIG. 17 illustrates the intensity difference curve 84 of FIG. 14 and the first reflectance 92 of FIG. 16.

Referring to FIGS. 2 and 17, if the first peak 91 is smaller than the second peak 93 (i.e., Yes in S60), then the overlay measurement apparatus 40 may obtain a wavelength of a peak of the intensity difference curve 84 located near the first peak 91 (in S70).

The wavelength of the obtained peak may be different from those of the highest and lowest peaks 842 and 844. The wavelength of the obtained peak may be chosen as a wavelength for the diffraction light 82, which has lower reflectance, in a subsequent overlay measurement process, and in this case, the reliability of the overlay measurement process may be increased. In the example of FIG. 17, if the wavelength of the first peak 91 is about 820 nm, wavelengths of the highest and lowest peaks of the intensity difference curve 84, which are located near the first peak 91, may be about 750 nm and about 850 nm.

Referring to FIG. 2, if the first peak 91 is not smaller than the second peak 93 (i.e., No in S60), then the overlay measurement apparatus 40 may obtain a wavelength of a peak of the intensity difference curve 84 located near the second peak 93 (in S80).

The wavelength of the obtained peak may be chosen as a wavelength for the diffraction light 82, which has low reflectance, in a subsequent overlay measurement process. In the example of FIG. 17, if the wavelength of the second peak 93 is about 550 nm, wavelengths of the highest and lowest peaks of the intensity difference curve 84, which are located near the second peak 93, may be about 550 nm and about 650 nm, respectively.

Figure 18:
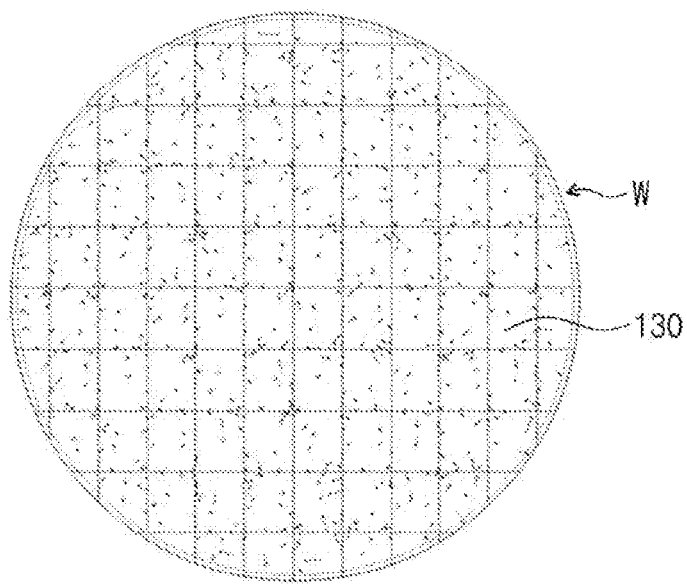
FIG. 18 is a plan view illustrating overlay measurement values obtained by a diffraction light that has a wavelength corresponding to a peak of the intensity difference curve of FIG. 17.

FIG. 18 illustrates overlay measurement values 130 obtained by the diffraction light 82 that has a wavelength corresponding to the peak of the intensity difference curve 84 of FIG. 17.

Referring to FIGS. 2 and 18, in the overlay measurement apparatus 40, the diffraction light 82 may be used to perform the overlay measurement process on the first and second diffraction patterns 116 and 126, and to obtain the overlay measurement values 130 (in S90).

In an example embodiment, the diffraction light 82 may have a wavelength corresponding to a peak of the intensity difference curve 84 located near a lower-reflectance peak of the first and second peaks 91 and 93. In an example embodiment, the diffraction light 82 may have a wavelength that is selected within a wavelength range whose upper and lower limits are given by peaks of the intensity difference curve 84, which are located near a lower-reflectance peak of the first and second peaks 91 and 93. In an example embodiment, the diffraction light 82 may have a wavelength that is substantially equal or similar to that of a peak of the intensity difference curve 84 located near a lower-reflectance peak of the first and second peaks 91 and 93.

When the first peak 91 is smaller than the second peak 93 and the wavelength of the first peak 91 is about 820 nm, the overlay measurement apparatus 40 may obtain the overlay measurement values 130 through the overlay measurement process that is performed using the diffraction light 82 having a wavelength (e.g., about 750 nm or about 850 nm in the example of FIG. 17) similar to the first peak 91. The diffraction light 82 may have a wavelength (e.g., about 750 nm to about 850 nm in the example of FIG. 17) between the peaks of the intensity difference curve 84 located near the first peak 91. In another implementation, the diffraction light 82 may have the same wavelength (e.g., 820 nm in the example of FIG. 17) as the first peak 91.

When the first peak 91 is not smaller than the second peak 93 and the wavelength of the second peak 93 is about 550 nm, the overlay measurement apparatus 40 may obtain the overlay measurement values 130 through the overlay measurement process that is performed using the diffraction light 82 having a wavelength (e.g., about 550 nm or about 650 nm in the example of FIG. 17) similar to the second peak 93. The diffraction light 82 may have a wavelength (e.g., from about 550 nm to about 650 nm in the example of FIG. 17) between the wavelength of the second peak 93 and the highest and lowest peaks 842 and 844. In another implementation, the diffraction light 82 may have the same wavelength (e.g., about 550 nm in the example of FIG. 17) as the second peak 93.

Referring to FIG. 18, the overlay measurement values 130 measured on the substrate W are depicted by arrows. For example, each of the overlay measurement values 130 may be depicted to represent an offset distance and an offset angle between the first and second diffraction patterns 116 and 126. A length of the arrow may represent the offset distance, and a direction of the arrow may represent the offset angle. A mean overlay value may be obtained from the overlay measurement values 130. In addition, an overlay correction value may be calculated from the overlay measurement values 130.

Figure 19:
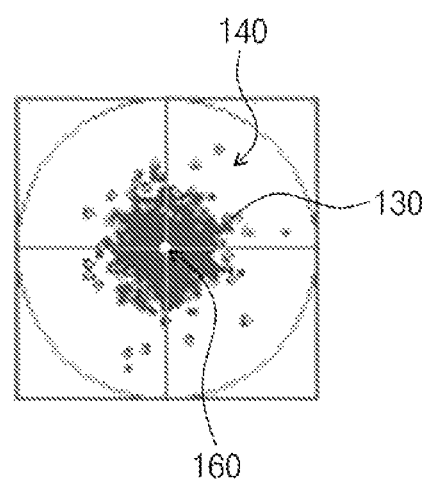
FIG. 19 is a diagram showing uniformity of overlay measurement values of FIG. 18.
Figure 20:
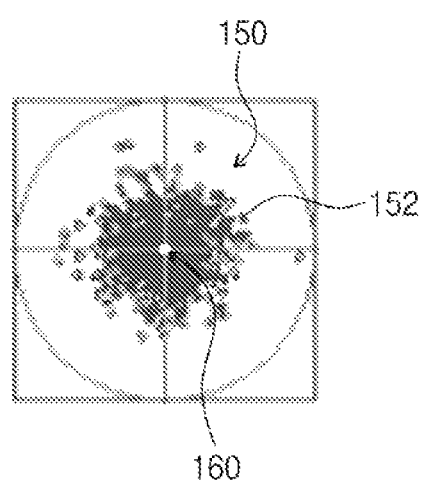
FIG. 20 is a diagram showing uniformity of overlay measurement values obtained by a general method.

FIG. 19 is a diagram showing uniformity 140 of the overlay measurement values 130 of FIG. 18. FIG. 20 is a diagram showing uniformity 150 of overlay measurement values obtained by a general comparative method.

Referring to FIGS. 19 and 20, the overlay uniformity 140 according to an example embodiment was better than the overlay uniformity 150 by the general method.

The overlay uniformity 140 according to an example embodiment may be obtained from the overlay measurement values 130 measured in consideration of the first reflectance 92 and the second reflectance 94. The overlay measurement values 130 may be represented as points around a central value 160, as shown in FIG. 19.

The overlay uniformity 150 by the general method may be obtained from comparative measurement values 152 measured without consideration of the first reflectance 92 and the second reflectance 94. The comparative measurement values 152 may be represented as points around the central value 160, as shown in FIG. 20.

The overlay measurement values 130 may be more densely distributed around the central value 160, compared with the comparative measurement values 152. The overlay measurement values according to an example embodiment may have an area that is smaller than an area of the comparative measurement values obtained by the general method; that is, the overlay uniformity 140 from a method according to an example embodiment may be better than the overlay uniformity 150 obtained by the general method.

Thus, according to an example embodiment, the diffraction light 82, whose wavelength is selected in consideration of the first reflectance 92 and the second reflectance 94, may be used to measure the overlay measurement values 130 of the parent and child patterns 114 and 124. Thus, it may be possible to increase the reliability of the overlay measurement process.

Referring back to FIG. 2, it may be examined whether the overlay measurement value 130 is smaller than a threshold value (in S100).

If the overlay measurement value 130 is not smaller than the threshold value (i.e., No in S100), the photoresist patterns 120 may be removed using, e.g., the spin-coating apparatus 20 or the cleaning apparatus (not shown) (in S110). The threshold value may be determined by an empirical method or an experiment. The photoresist patterns 120 may be removed by an organic solvent. Thereafter, the steps of forming the photoresist patterns 120 (in S20) to examining whether the overlay measurement value 130 is smaller than the threshold value (in S100) may be repeated.

If the overlay measurement value 130 is smaller than the threshold value (i.e., Yes in S100), an etching process using the child patterns 124 as a mask may be performed on the upper thin film 70 (in S120). Although not shown, upper patterns may be formed from the upper thin film 70 as a result of the etching process. In a subsequent overlay measurement process, the upper patterns on the peripheral region 62 may be used as parent patterns for other patterns.

Next, the host computer 10 may examine whether to terminate the unit process (in S130). If the unit process is to be repeated, the steps from the forming of the upper thin film 70 (in S20) to the etching step (in S120) may be repeated. In this case, the step of forming the photoresist pattern (in S30) may be performed in consideration of the overlay correction value of the overlay measurement value 130.

If the unit process is not to be repeated, the unit process may be terminated by the host computer 10.

By way of summation and review, overlay measurement values may be obtained from several positions on the substrate through the overlay measurement process, but the overlay measurement may produce different values for different measurement positions.

As described above, embodiments relate to a semiconductor device fabricating method including an overlay measurement process. In a method of fabricating a semiconductor device according to an example embodiment, by using a diffraction light in consideration of reflectance of a parent or child pattern, it may be possible to increase reliability of an overlay measurement process. Embodiments may provide a method that increases reliability in overlay measurement when a semiconductor device is fabricated.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   forming a lower pattern on a substrate, the lower pattern including a parent pattern;
   forming an upper thin film on the lower pattern and the substrate;
   forming a photoresist pattern on the upper thin film, the photoresist pattern including a child pattern located on the parent pattern;
   measuring a diffraction light from the parent and child patterns to obtain an intensity difference curve of the diffraction light versus its wavelength;
   measuring a first reflection light from the parent pattern to obtain a first reflectance versus its wavelength;
   measuring a second reflection light from the child pattern to obtain a second reflectance versus its wavelength;
   examining whether a first peak of the first reflectance is smaller than a second peak of the second reflectance; and
   obtaining a first wavelength corresponding to a peak of the intensity difference curve located near the first peak, and performing an overlay measurement process on the parent and child patterns using a diffraction light that has the first wavelength to obtain an overlay measurement value, when the first peak is smaller than the second peak.

2. The method as claimed in claim 1, further comprising finding a second wavelength corresponding to a peak of the intensity difference curve located near the second peak, when the first peak is not smaller than the second peak.

3. The method as claimed in claim 2, further comprising performing the overlay measurement process on the parent and child patterns using the diffraction light at the second wavelength to obtain the overlay measurement value, when the first peak is not smaller than the second peak.

4. The method as claimed in claim 1, wherein the substrate includes a cell region and a peripheral region which are adjacent to each other, and the peripheral region includes:
- a diffraction region;
- a first reflection region at one side of the diffraction region; and
- a second reflection region at another side of the diffraction region that is opposite to the first reflection region.

5. The method as claimed in claim 4, wherein the parent pattern includes:
- a first diffraction pattern formed in the diffraction region; and
- a first reflection pattern formed in the first reflection region.

6. The method as claimed in claim 5, wherein the child pattern includes:
- a second diffraction pattern formed in the diffraction region and on the first diffraction pattern; and
- a second reflection pattern formed in the second reflection region.

7. The method as claimed in claim 1, wherein each of the parent and child patterns includes grating patterns.

8. The method as claimed in claim 1, further comprising examining whether the overlay measurement value is smaller than a threshold value.

9. The method as claimed in claim 8, further comprising performing an etching process, in which the child pattern is used as a mask, on the upper thin film, when the overlay measurement value is smaller than the threshold value.

10. The method as claimed in claim 8, further comprising removing the photoresist pattern, when the overlay measurement value is not smaller than the threshold value.

* * * * *